US012796494B2

(12) United States Patent
Eom et al.

(10) Patent No.: US 12,796,494 B2
(45) Date of Patent: Nov. 10, 2026

(54) LEADFRAME-LESS SEMICONDUCTOR DEVICE ASSEMBLIES WITH DUAL-SIDED COOLING

(71) Applicant: SEMICONDUCTOR COMPONENTS INDUSTRIES, LLC, Scottsdale, AZ (US)

(72) Inventors: Jooyang Eom, Gimpo-si (KR); Inpil Yoo, Unterhaching (DE); Seungwon Im, Bucheon (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 464 days.

(21) Appl. No.: 18/471,703

(22) Filed: Sep. 21, 2023

(65) Prior Publication Data

US 2025/0105164 A1 Mar. 27, 2025

(51) Int. Cl.
*H10W 70/60* (2026.01)
*H10W 40/25* (2026.01)
(Continued)

(52) U.S. Cl.
CPC ....... *H10W 70/614* (2026.01); *H10W 40/255* (2026.01); *H10W 70/611* (2026.01);
(Continued)

(58) Field of Classification Search
None
See application file for complete search history.

(56) References Cited

U.S. PATENT DOCUMENTS 9,941,234 B2 4/2018 Liang
9,960,103 B2 5/2018 Hanada
(Continued)

FOREIGN PATENT DOCUMENTS

DE 102019113308 A1 11/2020
WO 2009150875 A1 12/2009

OTHER PUBLICATIONS

Hoang Linh Bach: "Vias in DBC substrates for embedded power modules", [Online] Jan. 1, 2018 (Jan. 1, 2018), XP093169012, Retrieved from the Internet on May 31, 2024: URL:https://ieeexplore.ieee.org/stampPDF/getPDF.jsp?tp=&arnumber=8403120&ref=aHR0cHM6Ly9pZWVIeHBsb3JILmIIZWUub3JnL2RvY3VTZW50Lzg0MDMxMjA=>.
(Continued)

*Primary Examiner* — Nicholas J Tobergte
(74) *Attorney, Agent, or Firm* — Brake Hughes Bellermann LLP

(57) ABSTRACT

In a general aspect, a semiconductor device assembly includes a first substrate including a first dielectric layer, and a first patterned metal layer disposed on a surface of the first dielectric layer. The assembly also includes a pre-molded semiconductor device module having a first side disposed on and electrically coupled with the first patterned metal layer, and a second substrate including a second dielectric layer, a second patterned metal layer disposed on a first surface of the second dielectric layer. The second patterned metal layer being is disposed on and electrically coupled with a second side of the module opposite the first side. The second substrate also includes a conductive via defined through the second dielectric layer. The conductive via electrically couples a signal terminal of the module with a patterned metal layer disposed on a second surface of the second dielectric layer opposite the first surface.

21 Claims, 9 Drawing Sheets

(51) Int. Cl.

| | |
|---|---|
| ***H10W 70/63*** | (2026.01) |
| ***H10W 74/10*** | (2026.01) |
| ***H10W 90/00*** | (2026.01) |

(52) U.S. Cl.
CPC ........ *H10W 70/635* (2026.01); *H10W 74/111* (2026.01); *H10W 90/00* (2026.01); *H10W 90/734* (2026.01)

(56) References Cited

U.S. PATENT DOCUMENTS

| | | | | |
|---|---|---|---|---|
| 2004/0245228 | A1* | 12/2004 | Liu ...................... | B23K 1/0056 219/121.76 |
| 2007/0235850 | A1* | 10/2007 | Gerber ................ | H10W 90/701 257/E23.068 |
| 2017/0162550 | A1* | 6/2017 | Das ....................... | H01L 23/481 |
| 2020/0126925 | A1 | 4/2020 | Michiaki et al. | |
| 2023/0238375 | A1 | 7/2023 | Liu | |

OTHER PUBLICATIONS

The International Search Report for counterpart application No. PCT/US2024/010043, mailed Jun. 11, 2024, 14 pages.

* cited by examiner

LEADFRAME-LESS SEMICONDUCTOR DEVICE ASSEMBLIES WITH DUAL-SIDED COOLING

TECHNICAL FIELD

This description relates to semiconductor device assemblies. More specifically, this description relates to leadframe-less power semiconductor device assemblies, that provide for dual-sided cooling.

BACKGROUND

Semiconductor device assemblies, such as assemblies including power semiconductor devices (which can be referred to as power modules, multi-chip power modules, etc.), can be implemented using semiconductor die, substrates (e.g., direct-bonded metal substrates, ceramic substrates, and so forth), wire bonds, etc., and include a leadframe.

SUMMARY

In a general aspect, a semiconductor device assembly includes a first substrate including a first dielectric layer, and a first patterned metal layer disposed on a surface of the first dielectric layer. The assembly also includes a pre-molded semiconductor device module having a first side disposed on and electrically coupled with the first patterned metal layer, and a second substrate including a second dielectric layer, a second patterned metal layer disposed on a first surface of the second dielectric layer. The second patterned metal layer being disposed on and electrically coupled with a second side of the pre-molded semiconductor device module opposite the first side. The second substrate also includes a conductive via defined through the second dielectric layer. The conductive via electrically couples a signal terminal of the pre-molded semiconductor device module with a third patterned metal layer disposed on a second surface of the second dielectric layer opposite the first surface.

Implementations can include one or more of the following features or aspects, alone or in combination. For example, the assembly can include at least one power terminal that is welded to the first patterned metal layer. The assembly can include an output signal terminal that is welded to the first patterned metal layer.

The assembly can include a plurality of electrically conductive spacers that are respectively coupled with the first patterned metal layer; and respectively coupled with the second patterned metal layer.

The conductive via can be a first conductive via of a plurality of conductive vias defined through the second dielectric layer. The plurality of conductive vias can electrically couple respective signal terminals of the pre-molded semiconductor device module with respective portions of the third patterned metal layer.

The pre-molded semiconductor device module can be a first pre-molded semiconductor device module. The assembly can include a second pre-molded semiconductor device module having a first side disposed on and electrically coupled with the first patterned metal layer, and a second side opposite the first side disposed on and electrically coupled with the second patterned metal layer.

The conductive via can be a first conductive via. The second substrate can include a second conductive via electrically coupling a signal terminal of the second pre-molded semiconductor device module with the third patterned metal layer disposed on the second surface of the second dielectric layer.

The first conductive via can be included in a first plurality of conductive vias defined through the second dielectric layer. The second conductive via can be included in a second plurality of conductive vias defined through the second dielectric layer. The first plurality of conductive vias can electrically couple respective signal terminals of the first pre-molded semiconductor device module with respective portions of the third patterned metal layer. The second plurality of conductive vias can electrically couple respective signal terminals of the second pre-molded semiconductor device module with respective portions of the third patterned metal layer.

The assembly can include a molding compound that encapsulates the first pre-molded semiconductor device module, the second pre-molded semiconductor device module, and a plurality of electrically conductive spacers respectively coupled with the first patterned metal layer and the second patterned metal layer. The molding compound can partially encapsulate the first substrate, the second substrate, an output signal terminal that is welded to the first patterned metal layer, and a plurality of power supply terminals that are respectively welded to the first patterned metal layer.

A surface of the patterned metal layer disposed on the second surface of the second dielectric layer can be exposed through the molding compound.

An area of the surface of the first dielectric layer of the first substrate can be greater than an area of the first surface of the second dielectric layer of the second substrate.

In another general aspect, a semiconductor device assembly includes a first substrate including a first dielectric layer; and a first patterned metal layer. The first patterned metal layer includes a first portion disposed on a surface of the first dielectric layer, and a second portion that extends off the surface of the first dielectric layer. The assembly also includes a pre-molded semiconductor device module having a first side disposed on and electrically coupled with the first portion of the first patterned metal layer. The second portion of the first patterned metal layer is electrically coupled with a signal terminal of the pre-molded semiconductor device module via the first portion of the first patterned metal layer. The assembly further includes a second substrate including a second dielectric layer, and a second patterned metal layer disposed on a surface of the second dielectric layer. The second patterned metal layer is disposed on and electrically coupled with a second side of the pre-molded semiconductor device module opposite the first side.

Implementations can include one or more of the following features or aspects, alone or in combination. For example, the assembly can include at least one power terminal that is welded to the second patterned metal layer. The assembly can include an output signal terminal that is welded to the second patterned metal layer.

The assembly can include an electrically conductive spacer that is coupled with the pre-molded semiconductor device module and the second patterned metal layer.

The assembly can include a plurality of electrically conductive spacers being respectively coupled with the first portion of the first patterned metal layer; and respectively coupled with the second patterned metal layer.

The second portion of the first patterned metal layer can include a plurality of extensions that are electrically coupled with respective signal terminals of the pre-molded semiconductor device module.

The pre-molded semiconductor device module can be a first pre-molded semiconductor device module. The semiconductor device assembly can include a second pre-molded semiconductor device module having a first side disposed on and electrically coupled with the first patterned metal layer; and a second side opposite the first side disposed on and electrically coupled with the second patterned metal layer.

The second portion of the first patterned metal layer can include a first plurality of extensions that are electrically coupled with respective signal terminals of the first pre-molded semiconductor device module, and a second plurality of extensions that are electrically coupled with respective signal terminals of the second pre-molded semiconductor device module.

The assembly can include molding compound that encapsulates the first pre-molded semiconductor device module, the second pre-molded semiconductor device module, and a plurality of electrically conductive spacers respectively coupled with the first patterned metal layer and the second patterned metal layer. The molding compound can partially encapsulate the first substrate, the second substrate, an output signal terminal that is welded to the second patterned metal layer, and a plurality of power supply terminals that are respectively welded to the second patterned metal layer.

The molding compound can encapsulate the first portion of the first patterned metal layer. The molding compound can be excluded from the second portion of the first patterned metal layer.

An area of the surface of the first dielectric layer of the first substrate can be greater than an area of the surface of the second dielectric layer of the second substrate.

In another general aspect, a method for producing a semiconductor device assembly includes coupling at least one pre-molded semiconductor device module with a first patterned metal layer disposed on a surface of a first dielectric layer of a first substrate, and coupling an output terminal and at least one power supply terminal with a second patterned metal layer disposed on a first surface of a second dielectric layer of a second substrate. The second substrate has a plurality of conductive vias disposed through the second dielectric layer. The plurality of conductive vias electrically couple respective signal terminals of the at least one pre-molded semiconductor device module with respective portions of a patterned metal layer disposed on a second surface of the second dielectric layer opposite the first surface. The method further includes coupling the second patterned metal layer with the at least one pre-molded semiconductor device module; and with the first patterned metal layer via a plurality of conductive spacers.

Figure 1:
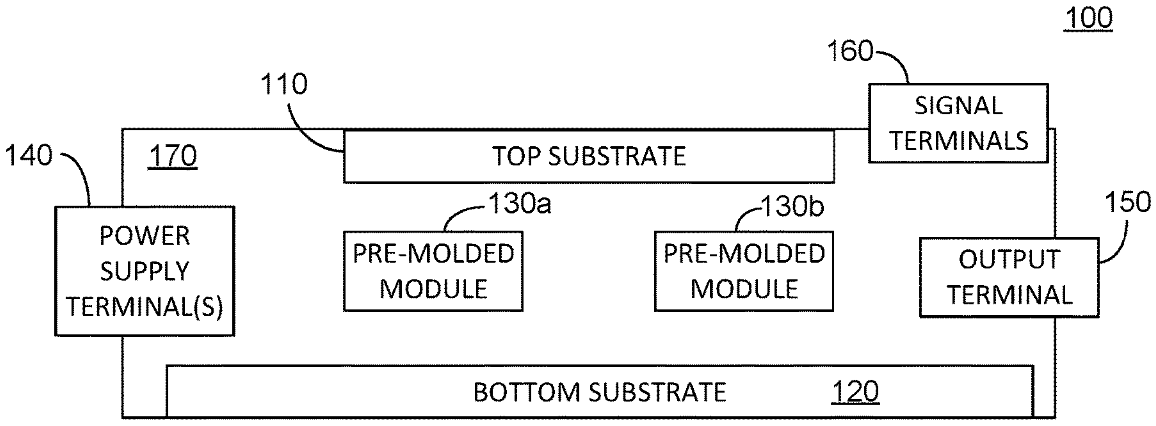
FIG. 1 is a block diagram schematically illustrating an example semiconductor device assembly.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to implementations of electronic device assemblies, e.g., power semiconductor device assemblies, such as multichip modules (MCMs) that facilitate dual-sided cooling. Such assemblies can be used in, e.g., automotive applications, industrial applications, etc. For instance, the implementations described herein can implement (include) high-power semiconductor device modules, such as power converters, ignition circuits, power transistor pairs, half-bridge circuits, etc. For purposes of illustration, and by way of example, disclosed implementations are described as implementing half-bridge circuits. In some implementations, other circuits can be implemented using the approaches described herein.

In prior implementations, semiconductor device assemblies (assemblies) with dual-sided cooling can include, in addition to a plurality of semiconductor die, multiple substrates, such as direct-bonded metal (DBM) substrates, and a leadframe, e.g., a single body leadframe including signal leads, and power and/or output terminals. The DBM substrates, e.g., direct-bonded copper (DBC) substrates, are used, e.g., in combination with a heatsink, fluidic cooling jacket, etc., to dissipate thermal energy generated during electrical operation of the assembly. In such implementations, a size of an associated assembly, e.g., size of the associated substrates, can be limited by its leadframe. In other words, use of a leadframe can prevent, or limit, reducing a size of a corresponding assembly, such as a size (or respective sizes) of DBM substrates included in the assembly. This limitation can, in turn, prevent reduction of material costs and associated manufacturing costs.

Also, tooling used for producing such prior assemblies including leadframe structures can limit manufacturing throughput, e.g., can be a factor that limits a number of assemblies that can be produced in a given time period, such as a number of units per hour (uph). Furthermore, use of a leadframe can contribute to parasitic impedance, e.g., stray inductance, associated with overall length (in a direction of current conduction) and size of power terminals of a leadframe structure that are included in an associated power semiconductor device assembly.

Prior implementations can also include electrically conductive spacers for providing interconnections between semiconductor die (e.g., bare semiconductor die) and associated substrates (e.g., DBM substrates, such as direct-bonded copper (DBC) substrates). Suitable materials for such spacers in prior implementations may be limited to materials with appropriate coefficients of thermal expansion, e.g., to prevent reliability issues related to thermal cycling, such as die cracking. For example, such materials include copper molybdenum (CuMo), or aluminum silicon carbide (AlSiC). Use of such spacer materials can increase associated product costs, as their cost is relatively high as compared to other electrically conductive spacer materials, such as pure copper, for example.

In comparison to prior semiconductor device assemblies, implementations described herein are leadframe-less semiconductor device assemblies that facilitate dual side cooling. That is, example implementations described herein exclude a leadframe. Accordingly, such implementations can provide for reduction in substrate sizes not achievable in prior implementations. Such size reductions can, in turn, reduce material and overall product costs.

The implementations described herein can be referred to as having a package-in-package configuration. That is, in example implementations, at least one pre-molded semiconductor device module can be included in a semiconductor device assembly. For instance, the at least one pre-molded semiconductor device module can be disposed between, and coupled with, a first (top) DBM substrate and a second (bottom) DBM substrate, which can then be molded using an epoxy molding compound. In example implementations described herein, a first pre-molded semiconductor device module of an assembly can include one more low-side transistors of a corresponding half-bridge circuit implemented in the assembly, while a second pre-molded semiconductor device module can include one more high-side transistors of the half-bridge circuit.

Also in the example implementations described herein, power terminals (and output terminals) that are shorter (along a direction of current flow), as compared to those of prior implementations can be used. Accordingly, parasitic impedance (stray inductance) associated with power terminals can be reduced in the example implementations, as compared to prior implementations having longer power terminals that are included in a single-body leadframe structure.

FIG. 1 is a block diagram schematically illustrating an example semiconductor device assembly 100. The semiconductor device assembly 100 is a leadframe-less semiconductor device assembly having a package-in-package arrangement. As shown in FIG. 1, the semiconductor device assembly 100 includes a top substrate 110 and a bottom substate 120. In this example, the indication of top and bottom is based on the arrangement in the view of FIG. 1. For instance, the top substrate 110 could also be referred to as a first substrate, a substrate, etc. Likewise, the bottom substate 120 could also be referred to as a second substrate, a substrate, etc. In other words, in the example of FIG. 1, the designations of top and bottom are for purposes of illustration.

The semiconductor device assembly 100 also includes pre-molded semiconductor modules 130*a* and 130*b*, e.g., packaged semiconductor device modules that are included in the package-in-package arrangement of the semiconductor device assembly 100. In this example, the pre-molded semiconductor module 130*a* can include one or more low-side transistors of a half-bridge circuit that is implemented by the semiconductor device assembly 100, while the pre-molded semiconductor module 130*b* can include one or more high-side transistors of the half-bridge circuit. Though not specifically shown in FIG. 1, electrical connections can be made between the pre-molded semiconductor modules 130*a*, the top substrate 110, the bottom substate 120, the one or more power supply terminals 140, the output terminal 150 and the signal terminals 160 to implement the half-bridge circuit (or other circuit) of the semiconductor device assembly 100. That is, while not specifically shown in FIG. 1, the pre-molded semiconductor modules 130*a* and 130*b* can be electrically and/or physically coupled with the top substrate 110 and/or the bottom substate 120. For instance, the top substrate 110 and the bottom substate 120, as well as at least one conductive spacer and respective solder connections, can provide electrical connections between the pre-molded semiconductor modules 130*a* and 130*b* and the substrates 110 and 120, e.g., to electrically couple the low-side transistors of the pre-molded semiconductor module 130*a* with the high-side transistors of the pre-molded semiconductor module 130*b*.

As shown in FIG. 1, the semiconductor device assembly 100 also includes one or more power supply terminals 140 (e.g., a positive power supply terminal, a negative or ground power supply terminal, etc.), an output terminal 150 and signal terminals 160. In this example, the output terminal 150 can be a terminal used for an output signal (e.g., a switching node signal) of the half-bridge circuit of the semiconductor device assembly 100, while the signal terminals 160 can provide connections for gate, source sensing and thermal sensing for the transistors of the half-bridge circuit.

The semiconductor device assembly 100 also includes a molding compound 170, such as an epoxy molding compound, that can encapsulate portions of the other elements of the semiconductor device assembly 100. For instance the molding compound 170 can encapsulate the pre-molded semiconductor modules 130*a* and 130*b* (and any conductive spacers included in the semiconductor device assembly 100). Further, the molding compound 170 can at least partially encapsulate the top substrate 110, the bottom substate 120, the one or more power supply terminals 140, the output terminal 150 and the signal terminals 160. That is respective portions of each of the top substrate 110, the bottom substate 120, the one or more power supply terminals 140, and the output terminal 150 can be encapsulated in the molding compound 170, while other respective portions are accessible and/or disposed outside of (exposed through, etc.) the molding compound 170. In some implementations, exposed portions (e.g., metal layers) of the top substrate 110 and the bottom substate 120 can be coupled with respective thermal dissipation devices, such as0 heatsinks or fluidic cooling jackets, which can provide for efficient dual-sided cooling of the semiconductor device assembly 100 during operation.

In the semiconductor device assembly 100 (and other example implementations described herein), the signal terminals 160 are implemented without use of signal leads of a leadframe, such as using the approaches described hereinbelow. Briefly, in some implementations, the signal terminals 160 can be implemented using at least one of respective portions of a patterned metal layer of the top substrate 110, respective portions of a patterned metal layer of the bottom substate 120, and/or respective conductive vias formed (e.g., defined, etc.) through the top substrate 110 and/or the bottom substate 120. Such approaches are provided by way of example, and other approaches for implementing the signal terminals 160 in the semiconductor device assembly 100 are possible.

In some implementations, as noted above, the semiconductor device assembly 100 can include additional elements other than those shown in FIG. 1. For instance, the semiconductor device assembly 100 can include one or more conductive spacers for coupling (e.g., physically and/or electrically) the top substrate 110 with the bottom substate 120, and/or coupling (e.g., physically and or electrically) the pre-molded semiconductor modules 130*a* and 130*b* with one, or both of the substrates 110 and 120.

FIGS. 2A to 2E are diagrams illustrating an example semiconductor device assembly 200 and components of that assembly. The semiconductor device assembly 200 can implement the semiconductor device assembly 100 of FIG. 1. For instance, the semiconductor device assembly 200 can include a half-bridge circuit, where the assembly 200 has a leadframe-less, package-in-package configuration.

Figure 2A:
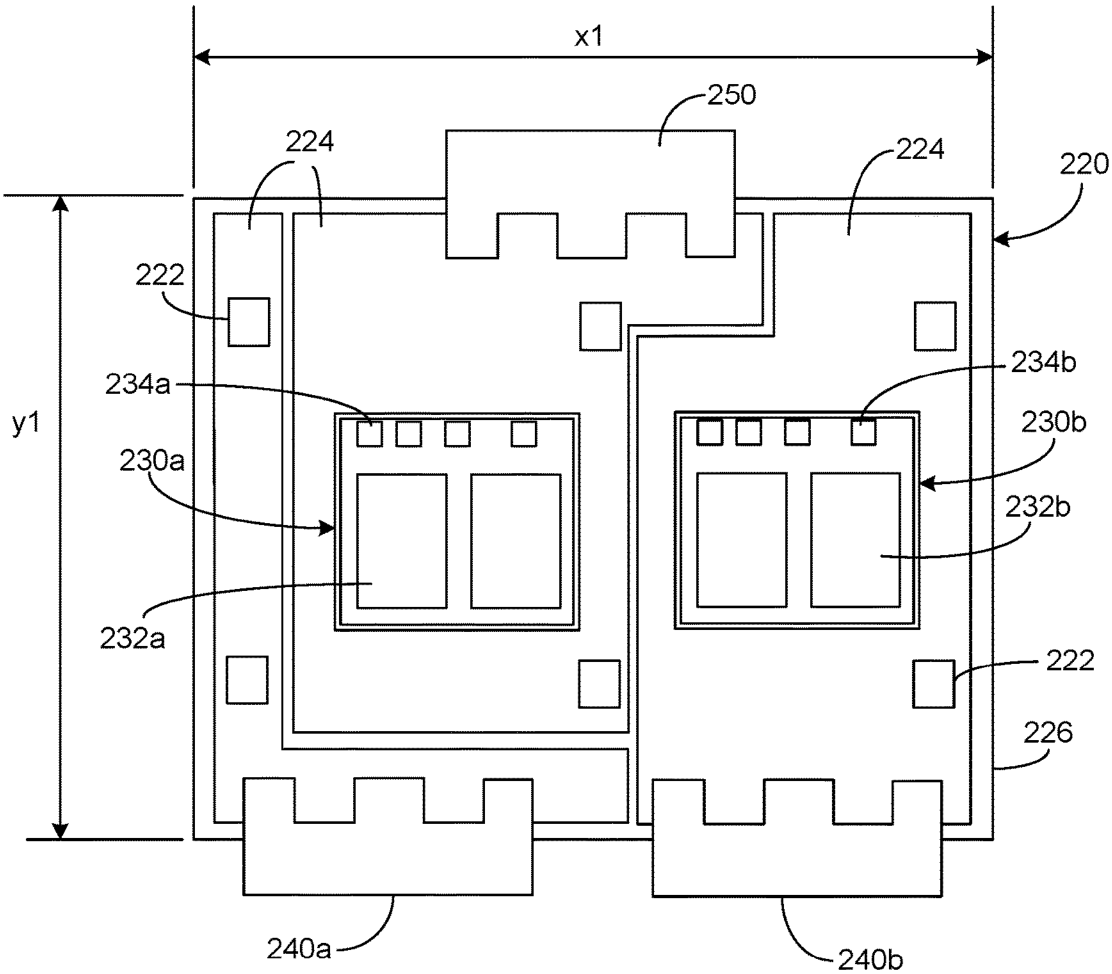
FIGS. 2A to 2E are diagrams illustrating an example semiconductor device assembly and components of that assembly.

Referring to FIG. 2A, a substrate 220 (e.g., bottom substrate) is shown. The substrate 220 has a width x1 and a height y1. The substrate 220 includes a patterned metal layer 224 that is disposed on (direct-bonded to) a dielectric layer 226, which can be a ceramic base layer of a DBM substrate. While not specifically discussed with respect to each example substrate described herein, each of the substrates of the example implementations can have a similar arrangement as the substrate 220, e.g., a dielectric layer having at least metal layer (patterned or unpatterned) disposed on (direct-bonded to) respective surfaces of the dielectric layer. For instance, a substrate can have a first metal layer (e.g., patterned metal layer) on a first surface, and a second metal layer (e.g., patterned or unpatterned) on a second surface opposite the first surface.

In the example of FIGS. 2A-2E, as shown in FIG. 2A, a plurality of conductive spacers 222 (electrically conductive spacers) are coupled with the patterned metal layer 224 of the substrate 220. In some implementations, the conductive spacers 222 can be soldered to the patterned metal layer 224. In other implementations, the conductive spacers 222 could be brazed, sintered, etc. to the patterned metal layer 224.

As further shown in FIG. 2A, a pre-molded semiconductor module 230*a* and a pre-molded semiconductor module 230*b* are also disposed on (coupled to) the patterned metal layer 224. For instance, the pre-molded semiconductor modules 230*a* and 230*b* can be coupled with the patterned metal layer 224 via respective solder connections.

In this example, the pre-molded semiconductor module 230*a* includes a first low-side transistor and a second low-side transistor of a half-bridge circuit of the semiconductor device assembly of FIGS. 2A-2E. The two low-side transistors can be connected in parallel with each other in the pre-molded semiconductor module 230*a*, and a common drain connection (e.g., a die attach paddle of the pre-molded semiconductor module 230*a*) is coupled with a respective portion of the patterned metal layer 224.

Also in this example, the pre-molded semiconductor module 230*b* includes a first high-side transistor and a second high-side transistor of the half-bridge circuit of the semiconductor device assembly of FIGS. 2A-2E. The two high-side transistors can be connected in parallel with each other in the pre-molded semiconductor module 230*b*, and a common drain connection (e.g., a die attach paddle of the pre-molded semiconductor module 230*b*) is coupled with a respective portion of the patterned metal layer 224. The pre-molded semiconductor modules 230*a* and 230*b* also include respective source connections 232*a* and 232*b* for the low-side and high-side transistors. Further, the pre-molded semiconductor modules 230*a* and 230*b* include respective signal connections 234*a* and 234*b*, e.g., for gate, source sense and thermal sense signals of the corresponding pre-molded semiconductor module.

As also shown in FIG. 2A, a power terminal 240*a* (e.g., a negative power supply or electrical ground terminal), a power terminal 240*b* (e.g., a positive power supply terminal), and an output signal terminal 250 (e.g., a switching node terminal) are coupled with respective portions of the patterned metal layer 224. In some implementations, the power terminal 240*a*, the power terminal 240*b*, and the output terminal 250 can be laser welded to their respective portions of the patterned metal layer 224. In some implementations, other attachment processes can be used, such as soldering, brazing, sintering, etc. In this example, the power terminal 240*a*, the power terminal 240*b*, and the output terminal 250 can be shorter in length (e.g., in a direction of current flow during electrical operation) than power and output terminals of prior assemblies implemented using a single-body leadframe structure. Accordingly, lower parasitic inductance (stray inductance) can be realized by the example implementation of FIGS. 2A-2E as compared to prior device assemblies.

Figure 2B:
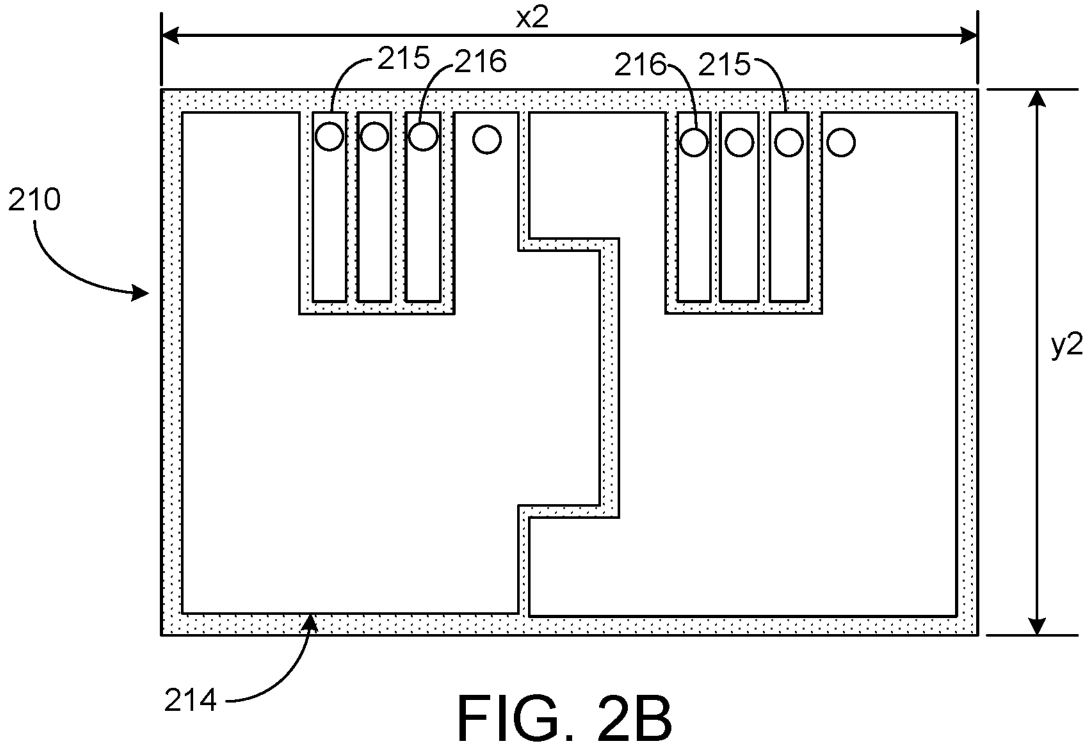
Figure 2C:
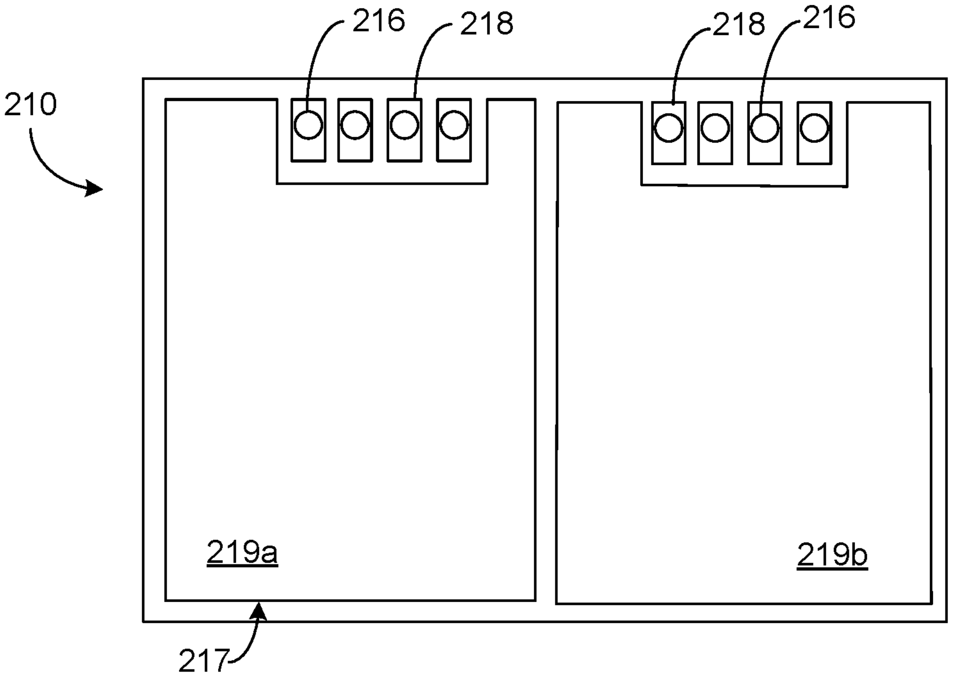

In this example, the conductive spacers 222 are used to electrically couple, as well as physically couple (e.g. via solder connections), the substrate 220 with a corresponding substrate (top substrate), such as a substrate 210 shown in FIGS. 2B and 2C. Specifically, FIG. 2B illustrates a first side of the substrate 210 that, in this example, is coupled with the conductive spacers 222, and FIG. 2C illustrates a second side of the substrate 210, e.g., that can be exposed through a molding compound of the semiconductor device assembly 200. The second side of the substrate 210 is, in this example, opposite the first side of the substrate 210.

As shown in FIG. 2B, the substrate 210 has a width x2 and a height y2. In this example, the width x2 of the substrate 210 is less than the width x1 of the substrate 220. Also in this example, the height y2 of the substrate 210 is less than the height y1 of the substrate 220. This reduction in size is facilitated, at least in part, by the leadframe-less arrangement of the semiconductor device assembly 200 of FIGS. 2A-2E. That is, the size of the substrate 210 and/or the size of the substrate 220 are not limited by connections to a corresponding leadframe structure. Accordingly, as the dimensions of the substrate 210 are smaller than the dimensions of the substrate 220 in this example, an area of the substrate 210 will be less than an area of the substrate 220 (e.g., the area of the substrate 220 is greater than an area of the substrate 210). This can reduce materials costs as compared to prior approaches and, in turn, can reduce overall product cost.

Referring to FIG. 2B, the illustrated side of the substrate 210 includes a patterned metal layer 214. The patterned metal layer 214 can include signal terminal portions 215 that are configured to be respectively coupled with the signal connections 234*a* and 234*b* of the pre-molded semiconductor modules 230*a* and 230*b*. As shown in FIG. 2B (as well as in FIG. 2C), the substrate 210 also includes a plurality of conductive vias 216 that are configured to electrically couple corresponding portions of the patterned metal layer 214 (e.g., the signal terminal portions 215) on the side of the substrate 210 shown in FIG. 2B with the signal metal portions 218 of a patterned metal layer 217 disposed on the second side of the substrate 210, e.g., as shown in FIG. 2B. In example implementations, a thermal dissipation device can be coupled to at least a portion of the patterned metal layer 217.

In this example, as illustrated in FIG. 2C, the plurality of conductive vias 216 are also coupled with the signal metal portions 218 on the second side of the substrate 210, e.g., to electrically couple the signal metal portions 218 with the respective signal connections 234*a* of the pre-molded semiconductor module 230*a*, and the respective signal connections 234*b* of the pre-molded semiconductor module 230*b*. In some implementations, the plurality of conductive vias 216 can be filled with an electrically conductive material (e.g., copper, tungsten, an alloy of copper, etc.). In other implementations, the plurality of conductive vias 216 can be lumens that are lined with an electrically conductive material, where the plurality of conductive vias 216 are configured to receive a respective signal pin. In this example, the patterned metal layer 217 also includes a portion 219*a* and a portion 219*b*, which are illustrated as separate metal portions. In some implementations, a thermal dissipation device (e.g., a heat sink, a fluidic cooling pipe, etc.) can be coupled with the portions 219*a* and 219*b* of the patterned metal layer 217. In some implementations, the portion 219*a* and the portion 219*b* could be joined into a single metal layer portions. That is, a contiguous metal layer portion can be used in place of the separate portions 219*a* and 219*b*.

Figure 2D:
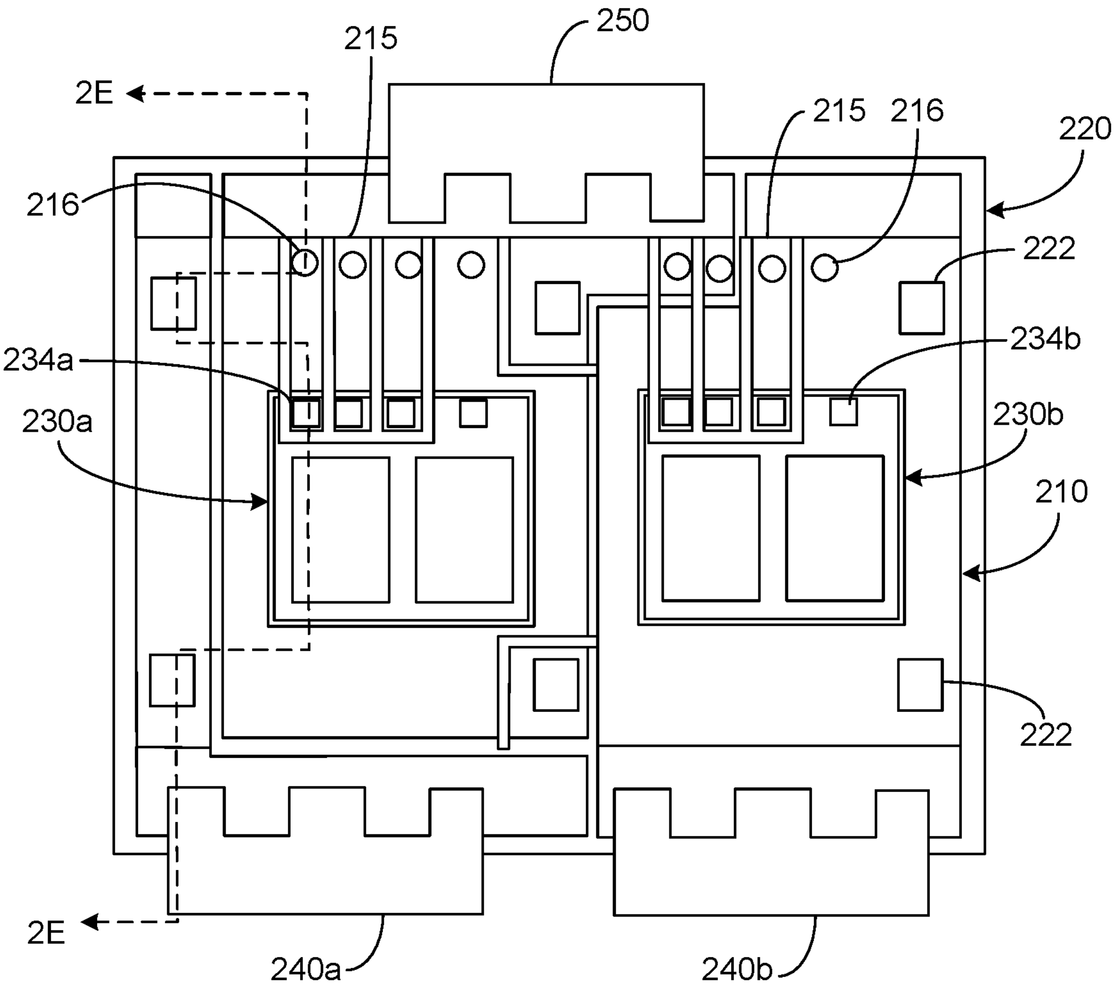

Referring to FIG. 2D, a diagram illustrating a combination of the substrate 210 with the structure of FIG. 2A is shown. That is, in the example of FIG. 2D, the substrate 210 is coupled with the conductive spacers 222, and with the pre-molded semiconductor modules 230*a* and 230*b* of the arrangement shown in FIG. 2A. Again, the surface of the substrate 210 coupled with the conductive spacers 222, in this example, is the surface of the substrate 210 illustrated in FIG. 2B. In this arrangement, the surface of the substrate 210 shown in FIG. 2C would be facing out of the page.

FIG. 2D is illustrated as a through-view, where features internal to the illustrated structure are visible, so as to show relative arrangements of various elements of the illustrated assembly. However, so as not to obfuscate the illustrated arrangements, not all features shown in FIGS. 2A, 2B and 2C are shown in FIG. 2D. For example, the signal metal portions 218 shown in FIG. 2C are not specifically shown in FIG. 2D, so as not to obscure the arrangement of the signal terminal portions 215 and the plurality of conductive vias 216 with the respective signal connections 234*a* of the pre-molded semiconductor module 230*a* and the respective signal connections 234*b* of the pre-molded semiconductor module 230*b*. In this example, the signal terminal portions 215 can be coupled to the respective signal connections 234*a* and the respective signal connections 234*b* using solder connections. As noted above, in this example, the plurality of conductive vias 216 provide respective electrical connections between the signal terminal portions 215 and the signal metal portions 218, though the signal metal portions 218 are not specifically illustrated in FIG. 2D.

Figure 2E:
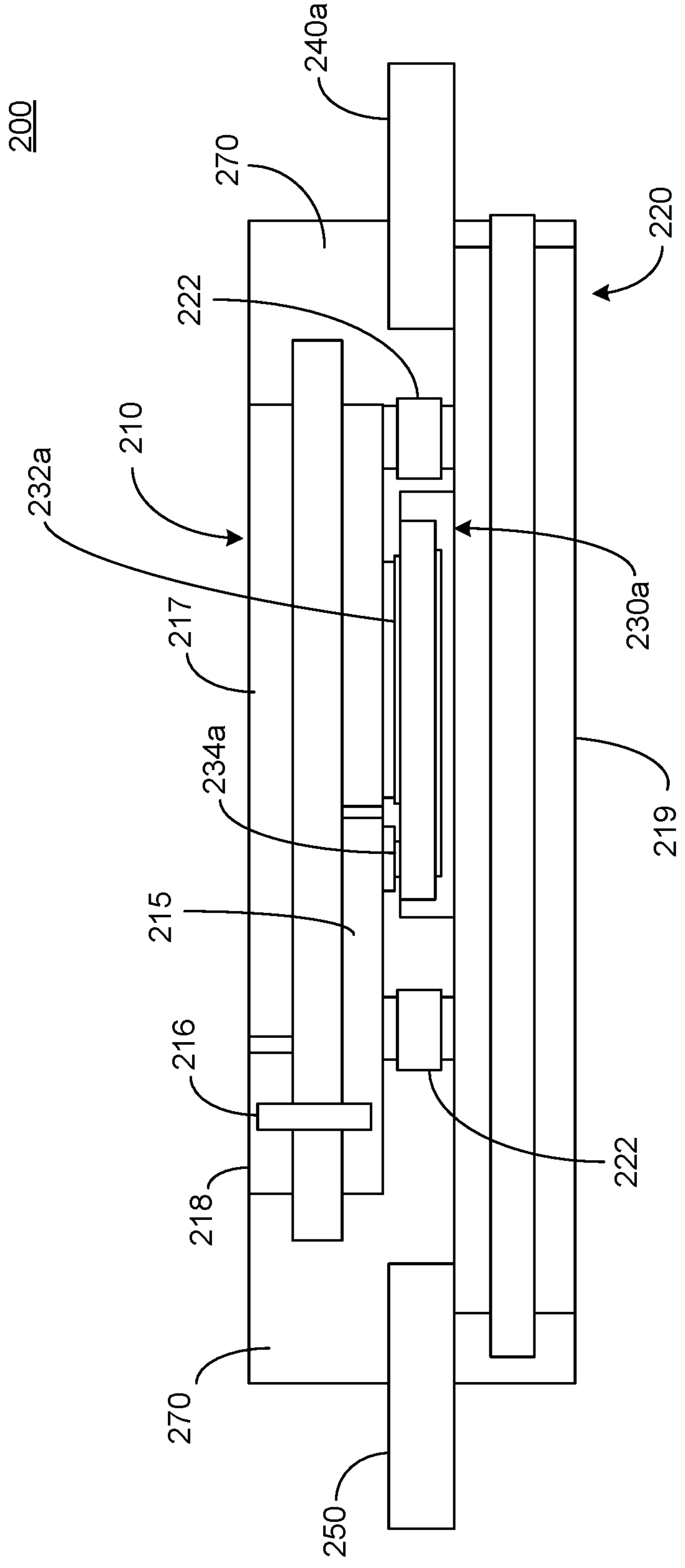

FIG. 2D also includes a line 2E-2E, which corresponds with a cross-sectional view of the semiconductor device assembly 200 shown in FIG. 2E. In this example, the view of FIG. 2E illustrates the structure shown in FIG. 2D after a molding operation and a cure operation, to encapsulate and/or partially encapsulated elements of the semiconductor device assembly 200, such as described herein. As shown in FIG. 2D, the line 2E-2E is not a straight line, and changes its path through the illustrated assembly, such that the line 2E-2E intersects various elements of the semiconductor device assembly 200 in correspondence with the view shown in FIG. 2E.

As shown in FIG. 2E, the substrate 210 is coupled with the conductive spacers 222 and the pre-molded semiconductor modules 230*a*. For instance, the illustrated signal terminal portion 215 is coupled with the illustrated signal connection 234*a* of the pre-molded semiconductor module 230*a*, such as with a solder connection. The conductive via 216 then couples the signal terminal portion 215 with a respective signal metal portion 218, which is exposed through a molding compound 270 of the semiconductor device assembly 200. Further, as shown in FIG. 2E, a source connection 232*a* of the pre-molded semiconductor modules 230*a* is also coupled with the substrate 210 (e.g., with a portion of the patterned metal layer 214.

In this example, the pre-molded semiconductor module 230*a*, and the conductive spacers 222 are encapsulated in the molding compound 270. Further, the substrate 210, the substrate 220, the power terminal 240*a*, and the output terminal 250 are partially encapsulated in the molding compound 270. For instance, the signal metal portion 218 is partially encapsulated, e.g., a surface of the signal metal portions 218 is exposed through the molding compound 270. Likewise, surfaces of metal layers of the substrate 210 (e.g., the patterned metal layer 217) and the substrate 220 (e.g., a metal layer 219) are exposed through the molding compound, e.g., to facilitate attachment of thermal dissipations devices (e.g., heatsinks and/or fluidically cooled jackets). Other elements of the semiconductor device assembly 200 that are not shown in the cross-sectional view of FIG. 2E can be encapsulated, or partially encapsulated in the molding compound 270 similar to the elements shown in FIG. 2E.

FIGS. 3A to 3D are diagrams illustrating another example semiconductor device assembly 300 and components of that assembly. As with the semiconductor device assembly 200, the semiconductor device assembly 300 can implement the semiconductor device assembly 100 of FIG. 1. For instance, the semiconductor device assembly 300 can include a half-bridge circuit, where the assembly 300 has a leadframe-less, package-in-package configuration.

Figure 3A:
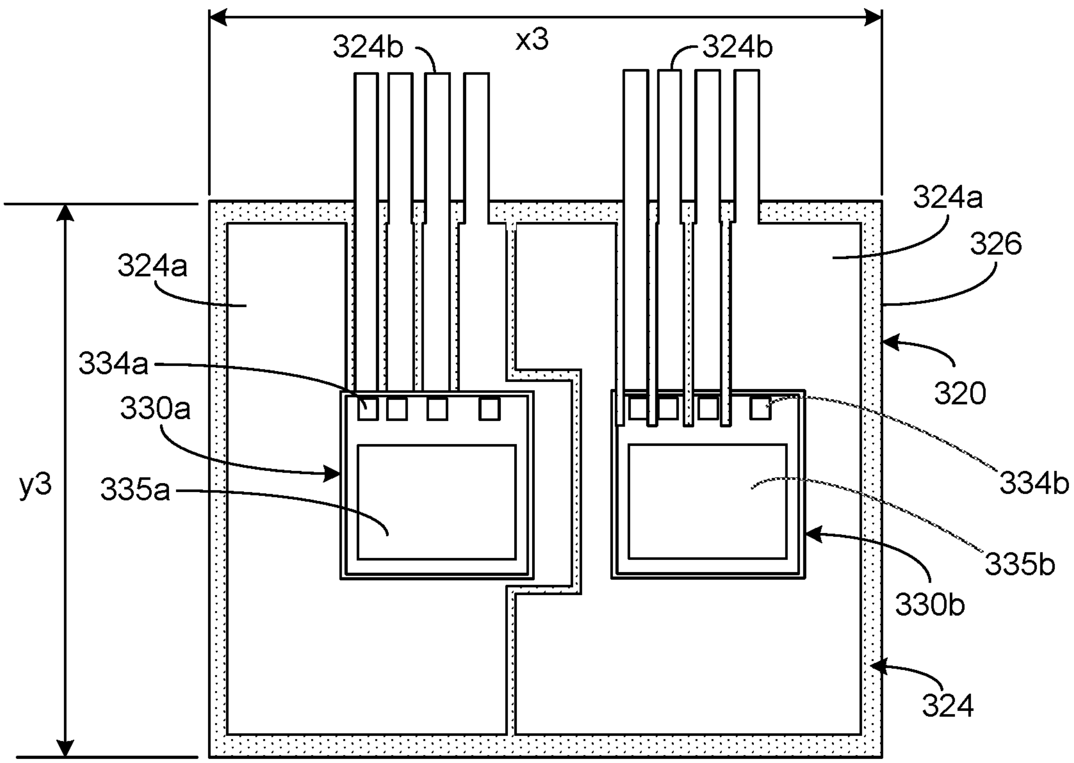
FIGS. 3A to 3D are diagrams illustrating another example semiconductor device assembly and components of that assembly.

Referring to FIG. 3A, a substrate 320 (e.g., bottom substrate) is shown. The substrate 320 has a width x3 and a height y3. The substrate 320 includes a patterned metal layer 324. The patterned metal layer 324 includes a portion 324*a* that is disposed on a dielectric layer 326 of the substrate 320, and a portion 324*b* that includes a plurality of extensions that extend from being disposed on the dielectric layer 326 to being off of the dielectric layer 326 (e.g., extending off the surface of the dielectric layer 326, extending away from the surface, etc.). The portion 324*b* of the patterned metal layer 324, in this example, can include respective signal terminal metal portions, e.g., for gate, source sense and thermal sense signals of pre-molded semiconductor modules 330*a* and 330*b*.

In the example of FIG. 3A-3D, as shown in FIG. 3A, the pre-molded semiconductor module 330*a* and the pre-molded semiconductor module 330*b* are disposed on (coupled to) both the portion 324*a* and the 324*b* of the patterned metal layer 324. For instance, the pre-molded semiconductor modules 330*a* and 330*b* can be coupled with the patterned metal layer 324 via respective solder connections. In this example, the pre-molded semiconductor module 330*a* includes at least one high-side transistor of a half-bridge circuit of the semiconductor device assembly of FIGS. 3A-3D, where multiple high-side transistors can be connected in parallel with each other in the pre-molded semiconductor module 330*a*, and a common drain connection 335*a* (e.g., a die attach paddle of the pre-molded semiconductor module 330*a*) is facing out of the page. Source connections of the pre-molded semiconductor module 330*a* (not shown) are coupled with the portion 324*a* of the patterned metal layer 324, and signal connections 334*a* are coupled with respective portions (patterned metal layer extensions) of the portion 324*b* of the patterned metal layer 324. In this example, the signal connections 334*a* are shown in a through-view in FIG. 3A, as well as in FIG. 3C, as they are downward facing in the views of FIGS. 3A and 3C.

Also in this example, the pre-molded semiconductor module 330*b* includes at least one low-side transistor of the half-bridge circuit, where multiple low-side transistors can be connected in parallel with each other in the pre-molded semiconductor module 330*b*, and a common drain connection 335*b* (e.g., a die attach paddle of the pre-molded semiconductor module 330*b*) is facing out of the page. Source connections of the pre-molded semiconductor module 330*b* (not shown) are coupled with the portion 324*a* of the patterned metal layer 324, and signal connections 334*b* are coupled with respective portions (patterned metal layer extensions) of the portion 324*b* of the patterned metal layer 324. In this example, as with the signal connections 334*a*, the signal connections 334*b* are shown in a through-view in FIG. 3A, as well as in FIG. 3C, as they are downward facing in the views of FIGS. 3A and 3C.

Figure 3B:
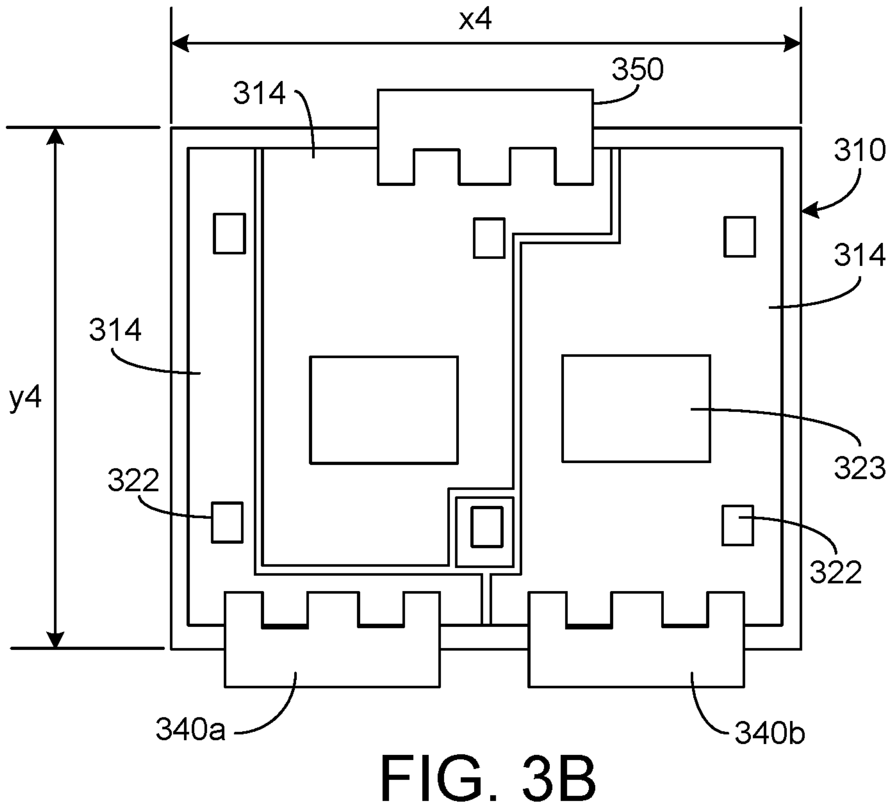
Figure 3C:
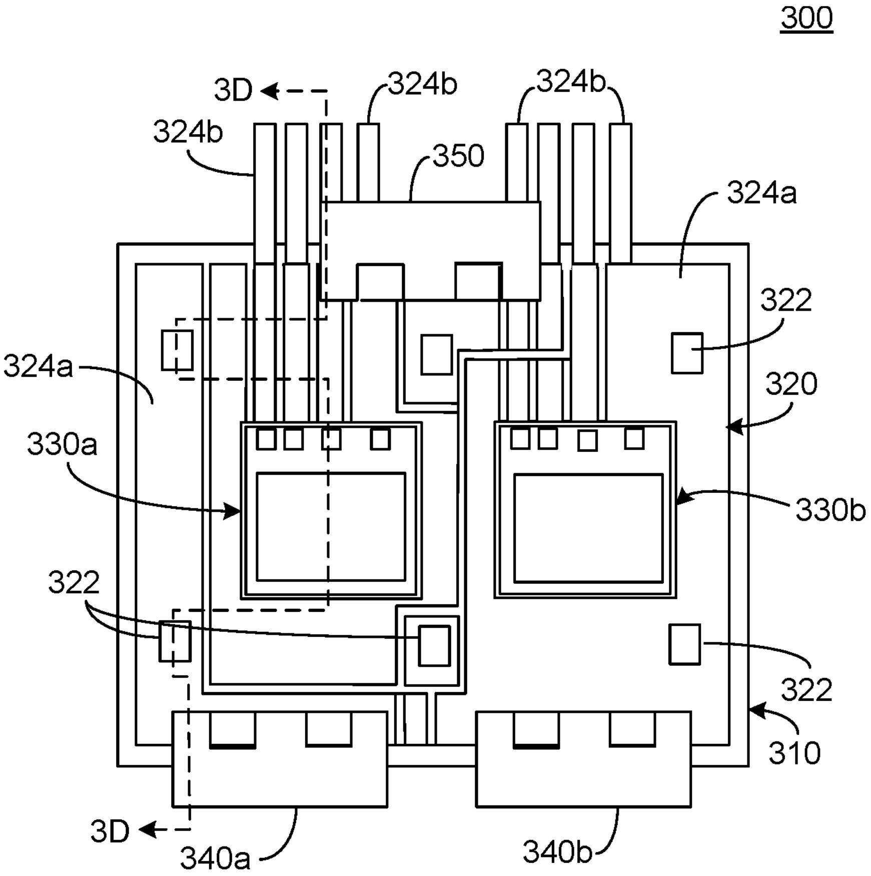
Figure 3D:
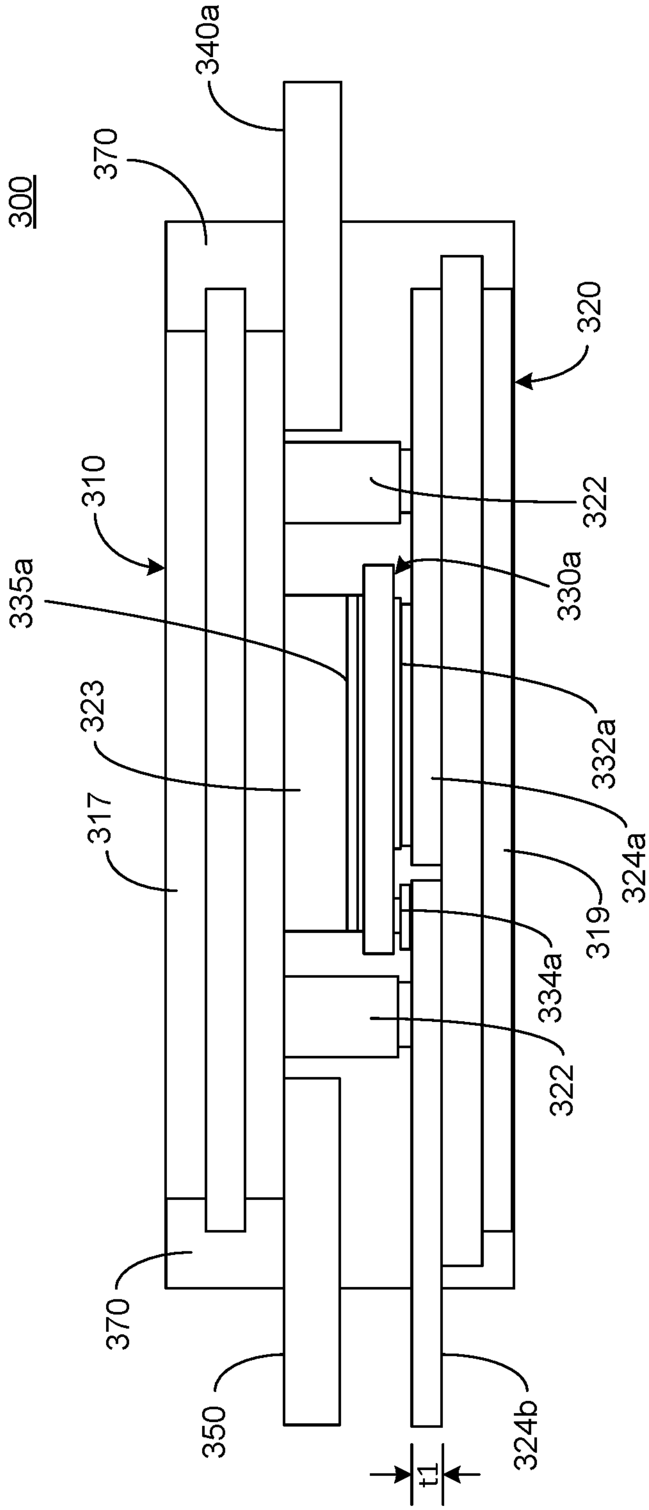

Referring to FIG. 3B, a structure including a substrate 310 (e.g., top substrate) of the semiconductor device assembly 300 of FIGS. 3A-3D is shown. In this example, a side of the structure shown in FIG. 3B is coupled with the structure shown in FIG. 3A to produce the semiconductor device assembly 300. That is, the structure of FIG. 3B, in this example, is inverted (rotated one-hundred eighty degrees) for attachment to the structure of FIG. 3A, such as shown in FIG. 3C. In this example, a side of the structure of FIG. 3B that faces into the page can, e.g., have a metal layer disposed thereon. As shown in FIG. 3D, that metal layer can be exposed through a molding compound for facilitating attachment of a thermal dissipation device.

As shown in FIG. 3B, the substrate 310 has a width x4 and a height y4. In this example, the width x3 of the substrate 310 is less than the width x3 of the substrate 320. Also in this example, the height y4 of the substrate 310 is less than the height y3 of the substrate 320. As with the substrates 210 and 220, this reduction in size is facilitated, at least in part, by the leadframe-less arrangement of the semiconductor device assembly 300 of FIGS. 3A-3D. That is, the size of the substrate 310 and/or the size of the substrate 320 are not limited by connections to a corresponding leadframe structure. Accordingly, as the dimensions of the substrate 310 are smaller than the dimensions of the substrate 320 in this example, an area of the substrate 310 is less than an area of the substrate 320 (e.g., the area of the substrate 320 is greater than the area of the substrate 310). This arrangement can reduce materials costs as compared to prior approaches and, in turn, can reduce overall product cost.

As shown in FIG. 3B, a plurality of conductive spacers 322 and 323 (electrically conductive spacers) are coupled with a patterned metal layer 314 of the substrate 310. In some implementations, the conductive spacers 322 and 323 can be soldered to the patterned metal layer 314. In other implementations, the conductive spacers 322 and 323 could be brazed, sintered, etc. to the patterned metal layer 314. In this example, the conductive spacers 322 can be coupled to the portion 324*a* of the patterned metal layer 324 on the substrate 320 in the corresponding semiconductor device assembly, while the conductive spacers 323 can be coupled, respectively, with the common drain connection 335*a* and the common drain connection 335*b* of the pre-molded semiconductor modules 330*a* and 330*b* that are disposed on the substrate 320. In some implementations, the conductive spacers 322 and 323 can be copper spacers, which can reduce material costs as compared to previous implementations that include CuMo and/or AlSiC conductive spacers.

As also shown in FIG. 3B, a power terminal 340*a* (e.g., a positive power supply terminal), a power terminal 340*b* (e.g., a negative power supply, or electrical ground terminal), and an output signal terminal 350 (e.g., a switching node terminal) are coupled with respective portions of the patterned metal layer 314. In some implementations, the power terminal 340*a*, the power terminal 340*b*, and the output terminal 350 can be laser welded to their respective portions of the patterned metal layer 314. In other implementations, the power terminal 340*a*, the power terminal 340*b*, and the output terminal 350 can be attached to the substrate 310 at a same time as the conductive spacers 322 and 323, e.g., using a solder reflow process, a brazing process, or a sintering process. In this example, the power terminal 340*a*, the power terminal 340*b*, and the output terminal 350 can be shorter in length (e.g., in a direction of current flow during electrical operation) than power and output terminals of prior assemblies implemented using a single-body leadframe structure. Accordingly, lower parasitic inductance (stray inductance) can be realized by the example implementation of FIGS. 3A-3D as compared to prior device assemblies.

Referring to FIG. 3C, a diagram illustrating a combination of the structure of FIG. 3B with the structure of FIG. 3A is shown. That is, in the example of FIG. 3C, the conductive spacers 322 and 323 of the structure of FIG. 3B are coupled, respectively, with the portion 324*a* of the patterned metal layer 324 and the pre-molded semiconductor modules 330*a* and 330*b*, as shown in FIG. 3C.

As with FIG. 2D, FIG. 3C is illustrated as a through-view, where features internal to the illustrated structure are visible, so as to show relative arrangements of various elements of the illustrated assembly. However, so as not to obfuscate the illustrated arrangements, not all features shown in FIGS. 3A and 3C are shown in FIG. 3C. For example, some edges of the substrate 310 are not shown in FIG. 3C, so as not to obscure the arrangement of the signal terminal extensions of the portion 324*b* of the patterned metal layer 324.

FIG. 3C also includes a line 3D-3D, which corresponds with a cross-sectional view of the semiconductor device assembly 300 shown in FIG. 3D. In this example, the view of FIG. 3D illustrates the structure shown in FIG. 3C after a molding operation and a cure operation, to encapsulate and/or partially encapsulated elements of the semiconductor device assembly 300, such as described herein. As shown in FIG. 3C, the line 3D-3D is not a straight line, and changes its path through the illustrated assembly, such that the line 3D-3D intersects various elements of the semiconductor device assembly 300 in correspondence with the view shown in FIG. 3D.

As shown in FIG. 3D, the substrate 320 (e.g., the portion 324*a* of the patterned metal layer 324) is coupled, e.g., via solder connection, with the conductive spacers 322, and the pre-molded semiconductor module 330*a*. As also shown in FIG. 3D, the illustrated conductive spacer 323 is coupled, e.g., via solder connection, with the common drain connection 335*a* of the pre-molded semiconductor module 330*a*, and the illustrated signal connection 334*a* of the pre-molded semiconductor module 330*a* is coupled with a respective signal terminal extension of the portion 324*b* of the patterned metal layer 324, where the portion 324*b* extends outside the molding compound. As shown in FIG. 3D, the portion 324*b* can have a thickness t1, which can be on the order of 0.3 millimeters (mm) in some implementations.

Further, as shown in FIG. 3D, a source connection 332*a* of the pre-molded semiconductor module 330*a* is also coupled with the substrate 320 (e.g., with the portion 324*a* of the patterned metal layer 324). In this example, the pre-molded semiconductor module 330*a*, and the conductive spacers 322 and 323 are encapsulated in a molding compound 370. Further, the substrate 210, the substrate 320, the power terminal 340*a*, the output terminal 350, and the portion 324*b* of the patterned metal layer 324 are partially encapsulated in the molding compound 370. For instance, the portion 324*b* is partially encapsulated and also extends out of the molding compound 370. Likewise, surfaces of metal layers of the substrate 310 (e.g., a metal layer 317) and the substrate 320 (e.g., a metal layer 319) are exposed through the molding compound 370, e.g., to facilitate attachment of thermal dissipations devices (e.g., heatsinks and/or fluidically cooled jackets). Other elements of the semiconductor device assembly 300 that are not shown in the cross-sectional view of FIG. 3D can be similarly encapsulated, or partially encapsulated in the molding compound 370 similar to the elements shown in FIG. 3D.

Figure 4:
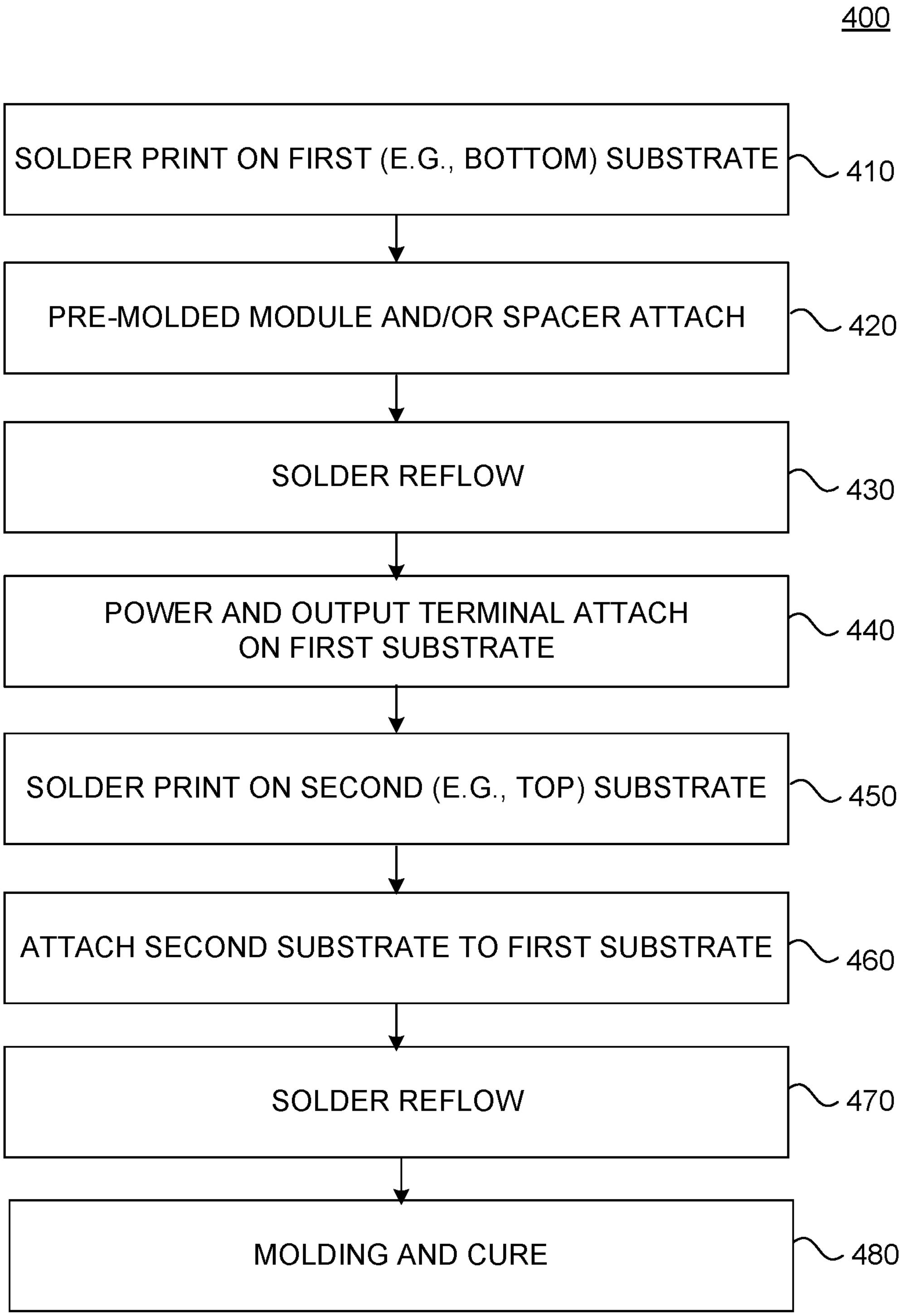
FIG. 4 is a flowchart illustrating a method for producing a semiconductor device assembly, such as the semiconductor assembly of FIGS. 2A to 2D.

FIG. 4 is a flowchart illustrating a method 400 for producing a semiconductor device assembly, such as the semiconductor device assembly illustrated in FIGS. 2A to 2E. Accordingly, the method 400 will be described with further reference to FIGS. 2A to 2E. However, in some implementations, the method 400 can be used to produce other semiconductor assemblies.

The method 400 includes, at block 410, performing a solder print operation on a first substrate, e.g., the (bottom) substrate 220. The solder print operation of block 410 can dispose solder on the substrate 220 (e.g., on the patterned metal layer 224) for attachment of the pre-molded semiconductor modules 230*a* and 230*b* and/or the conductive spacers 222. In some implementations, the conductive spacers 222 can be coupled with the substrate 210 prior to the solder print operation of block 410. At block 420, the method 400 includes attaching the pre-molded semiconductor modules 230*a* and 230*b* and/or the conductive spacers 222 to the solder of the print operation at block 410. For instance, the operation at block 420 of the method 400 can include disposing the pre-molded semiconductor modules 230*a* and 230*b* and/or the conductive spacers 222 on the solder applied at block 410 using automated placement equipment (e.g., pick and place equipment). At block 430, the method 400 includes performing a reflow operation to physically and electrically couple the pre-molded semiconductor modules 230*a* and 230*b* and/or the conductive spacers 222 with the patterned metal layer 224 of the substrate 220.

At block 440, the method 400 includes coupling the output terminal 250, and the power terminals 240*a* and 240*b* to the patterned metal layer 224 of the substrate 220. As discussed above, in some implementations, the output terminal 250, and the power terminals 240*a* and 240*b* can be coupled with the patterned metal layer 224 using laser welding. In other implementations, the output terminal 250 and the power terminals 240*a* and 240*b* can be coupled with the patterned metal layer 224 using solder (e.g., as part of operations of blocks 410, 420 and 430, with the operation of block 440 being omitted).

At block 450, the method 400 includes performing a solder print operation on a second substrate, e.g., the (top) substrate 210. The solder print of block 450 can dispose solder on the substrate 210 (e.g., on the patterned metal layer 214) for attachment of the substrate 210 to the substrate 220, e.g., to the conductive spacers 222 and the pre-molded semiconductor modules 230*a* and 230*b*. At block 460, the method 400 includes attaching the substrate 210 to the substrate 220. For instance, the substrate 210 can be automatically placed, e.g., using automated pick and placement equipment. on the substrate 220, e.g. vice versa, such that the patterned metal layer 214 is disposed on the conductive spacers 222 and the pre-molded semiconductor modules 230*a* and 230*b*, e.g., as shown in FIGS. 2D and 2E. At block 470, the method 400 includes performing a reflow operation to physically and electrically couple the substrate 220 with the substrate 210, e.g., couple the patterned metal layer 214 with the conductive spacers 222 and the pre-molded semiconductor modules 230*a* and 230*b*.

At block 480, a molding operation and a post-mold cure operation can be performed to encapsulate the semiconductor device assembly 200, such as shown in FIG. 2E. In this example, as the semiconductor device assembly 200 is produced without using a single-bodied leadframe (e.g., is leadframe-less), trim and form operations are not needed. This can increase manufacturing throughput, e.g., increase a number of assemblies produced per hour as compared to methods for producing semiconductor device assemblies with a leadframe structure.

Figure 5:
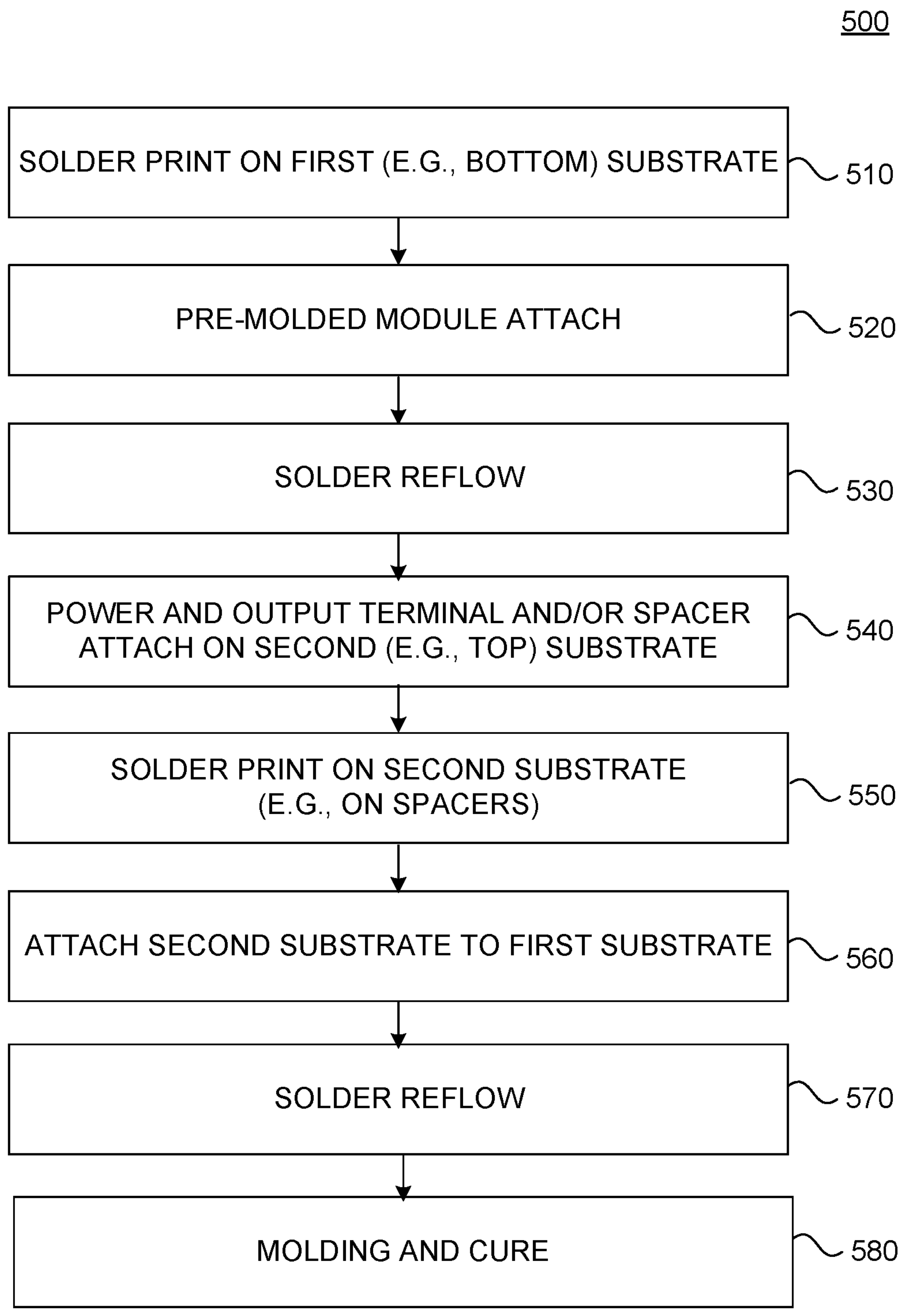
FIG. 5 is a flowchart illustrating a method for producing a semiconductor device assembly, such as the semiconductor assembly of FIGS. 3A to 3D.

FIG. 5 is a flowchart illustrating a method 500 for producing a semiconductor device assembly, such as the semiconductor device assembly illustrated in FIGS. 3A to 3D. Accordingly, the method 500 will be described with further reference to FIGS. 3A to 3D. However, in some implementations, the method 500 can be used to produce other semiconductor assemblies.

The method 500 includes, at block 510, performing a solder print operation on a first substrate, e.g., the substrate 320. The solder print operation of block 510 can dispose solder on the substrate 320 (e.g., on the portions 324*a* and 324*b* of the patterned metal layer 324) for attachment of the pre-molded semiconductor modules 330*a* and 330*b*. At block 520, the method 500 includes attaching the pre-molded semiconductor modules 330*a* and 330*b* to the solder of the print operation at block 510. For instance, the operation at block 520 of the method 500 can include disposing the pre-molded semiconductor modules 330*a* and 330*b* on the solder applied by the solder print operation of block 510 using automated placement equipment (e.g., pick and place equipment). At block 530, the method 500 includes performing a reflow operation to physically and electrically couple the pre-molded semiconductor modules 330*a* and 330*b* with the patterned metal layer 324 of the substrate 320.

At block 540, the method 400 includes coupling the output terminal 350, the power terminals 340*a* and 340*b*, the conductive spacers 322, and/or the conductive spacers to the patterned metal layer 314 of the substrate 210. As discussed above, in some implementations, the output terminal 350, and the power terminals 340*a* and 340*b* can be coupled with the patterned metal layer 314 using laser welding. In other implementations, the output terminal 350 and the power terminals 340*a* and 340*b* can be coupled with the patterned metal layer 324, along with the conductive spacers 322 and the conductive spacers 322 using solder (e.g., including a solder print operation, an attach (placement) operation, and a reflow operation at block 540).

At block 550, the method 500 includes performing a solder print operation on a second substrate, e.g., the substrate 310. The solder print of block 550 can dispose solder on the conductive spacers 322 and the conductive spacers 323 for attachment of the substrate 210 to the substrate 220, e.g., to the portion 324*a* of the patterned metal layer 324, and to the pre-molded semiconductor modules 330*a* and 330*b*. At block 560, the method 500 includes attaching the substrate 310 to the substrate 320. For instance, the substrate 310 (e.g., as shown in FIG. 3B) can be automatically placed, e.g., using automated pick and placement equipment. on the substrate 220, or vice versa, such that the conductive spacers 322 and the conductive spacers 323 are respectively disposed on the portion 324*a* of the patterned metal layer 324, and to the pre-molded semiconductor modules 330*a* and 330*b*, e.g., as shown in FIGS. 3C and 3D. At block 570, the method 500 includes performing a reflow operation to physically and electrically couple the substrate 310 with the substrate 320, e.g., couple the conductive spacers 322 and the conductive spacers 323 respectively with the portion 324*a* of the patterned metal layer 324, and the pre-molded semiconductor modules 330*a* and 330*b*.

At block 580, a molding operation and a post-mold cure operation can be performed to encapsulate the semiconductor device assembly 300, such as shown in FIG. 3D. In this example, as the semiconductor device assembly 300 is produced without using a single-bodied leadframe (e.g., is leadframe-less), trim and form operations are not needed. This can increase manufacturing throughput, e.g., increase a number of assemblies produced per hour as compared to methods for producing semiconductor device assemblies with a leadframe structure.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. For instance, features illustrated and/or aspects described with respect to one implementation can, where appropriate, also be included in, and/or apply to other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device assembly comprising:
a first substrate including
a first patterned metal layer disposed on a surface of a first dielectric layer;
a pre-molded semiconductor device module having a first side disposed on and electrically coupled with the first patterned metal layer;
a second substrate including:
a second patterned metal layer disposed on a first surface of a second dielectric layer, the second patterned metal layer being disposed on and electrically coupled with a second side of the pre-molded semiconductor device module opposite the first side; and
a conductive via defined through the second dielectric layer, the conductive via electrically coupling a signal terminal of the pre-molded semiconductor device module with a third patterned metal layer disposed on a second surface of the second dielectric layer opposite the first surface; and
a molding compound encapsulating the pre-molded semiconductor device module and partially encapsulating the first substrate and the second substrate, the third patterned metal layer being exposed through the molding compound.

2. The semiconductor device assembly of claim 1, further comprising:
at least one power terminal that is welded to the first patterned metal layer; and
an output signal terminal that is welded to the first patterned metal layer.

3. The semiconductor device assembly of claim 1, further comprising a plurality of electrically conductive spacers being respectively:
coupled with the first patterned metal layer; and
coupled with the second patterned metal layer.

4. The semiconductor device assembly of claim 1, wherein the conductive via is a first conductive via of a plurality of conductive vias defined through the second dielectric layer, the plurality of conductive vias electrically coupling respective signal terminals of the pre-molded semiconductor device module with respective portions of the third patterned metal layer.

5. The semiconductor device assembly of claim 1, wherein the pre-molded semiconductor device module is a first pre-molded semiconductor device module, the semiconductor device assembly further comprising:
a second pre-molded semiconductor device module having:
a first side disposed on and electrically coupled with the first patterned metal layer; and
a second side opposite the first side disposed on and electrically coupled with the second patterned metal layer.

6. The semiconductor device assembly of claim 5, wherein the conductive via is a first conductive via,
the second substrate further including a second conductive via electrically coupling a signal terminal of the second pre-molded semiconductor device module with the third patterned metal layer.

7. The semiconductor device assembly of claim 5, wherein the molding compound:
encapsulates the first pre-molded semiconductor device module, the second pre-molded semiconductor device module, and a plurality of electrically conductive spacers respectively coupled with the first patterned metal layer and the second patterned metal layer, and partially encapsulates the first substrate, the second substrate, an output signal terminal that is welded to the first patterned metal layer, and a plurality of power supply terminals that are respectively welded to the first patterned metal layer.

8. The semiconductor device assembly of claim 1, wherein an area of the surface of the first dielectric layer of the first substrate is greater than an area of the first surface of the second dielectric layer of the second substrate.

9. A semiconductor device assembly comprising:

a first substrate including:

a first dielectric layer; and a first patterned metal layer including:

a first portion disposed on a surface of the first dielectric layer; and a second portion that extends laterally off the surface of the first dielectric layer;

a pre-molded semiconductor device module having a first side disposed on and electrically coupled with the first portion of the first patterned metal layer, the second portion of the first patterned metal layer being electrically coupled with a signal terminal of the pre-molded semiconductor device module via the first portion of the first patterned metal layer; and a second substrate including:

a second dielectric layer; and a second patterned metal layer disposed on a surface of the second dielectric layer, the second patterned metal layer being disposed on and electrically coupled with a second side of the pre-molded semiconductor device module opposite the first side.

10. The semiconductor device assembly of claim 9, further comprising:

at least one power terminal that is welded to the second patterned metal layer; and an output signal terminal that is welded to the second patterned metal layer.

11. The semiconductor device assembly of claim 9, further comprising an electrically conductive spacer that is coupled with the pre-molded semiconductor device module and the second patterned metal layer.

12. The semiconductor device assembly of claim 9, further comprising a plurality of electrically conductive spacers being respectively:

coupled with the first portion of the first patterned metal layer; and coupled with the second patterned metal layer.

13. The semiconductor device assembly of claim 9, wherein the second portion of the first patterned metal layer includes a plurality of extensions that are electrically coupled with respective signal terminals of the pre-molded semiconductor device module.

14. The semiconductor device assembly of claim 9, wherein the pre-molded semiconductor device module is a first pre-molded semiconductor device module, the semiconductor device assembly further comprising:

a second pre-molded semiconductor device module having:

a first side disposed on and electrically coupled with the first patterned metal layer; and a second side opposite the first side disposed on and electrically coupled with the second patterned metal layer.

15. The semiconductor device assembly of claim 14, wherein the second portion of the first patterned metal layer includes:

a first plurality of extensions that are electrically coupled with respective signal terminals of the first pre-molded semiconductor device module; and a second plurality of extensions that are electrically coupled with respective signal terminals of the second pre-molded semiconductor device module.

16. The semiconductor device assembly of claim 15, further comprising a molding compound that:

encapsulates the first pre-molded semiconductor device module, the second pre-molded semiconductor device module, and a plurality of electrically conductive spacers respectively coupled with the first patterned metal layer and the second patterned metal layer, and partially encapsulates the first substrate, the second substrate, an output signal terminal that is welded to the second patterned metal layer, and a plurality of power supply terminals that are respectively welded to the second patterned metal layer.

17. The semiconductor device assembly of claim 16, wherein the molding compound:

encapsulates the first portion of the first patterned metal layer, and is excluded from the second portion of the first patterned metal layer.

18. The semiconductor device assembly of claim 9, wherein an area of the surface of the first dielectric layer of the first substrate is greater than an area of the surface of the second dielectric layer of the second substrate.

19. A method for producing a semiconductor device assembly, the method comprising:

coupling at least one pre-molded semiconductor device module with a first patterned metal layer disposed on a surface of a first dielectric layer of a first substrate;

coupling at least one pre-molded semiconductor device with a second patterned metal layer disposed on a first surface of a second dielectric layer of a second substrate, the second substrate having a plurality of conductive vias disposed through the second dielectric layer, the plurality of conductive vias electrically coupling respective signal terminals of the at least one pre-molded semiconductor device module with respective portions of a third patterned metal layer disposed on a second surface of the second dielectric layer opposite the first surface; and encapsulating the at least one pre-molded semiconductor device module and partially encapsulating the first substrate and the second substrate in a molding compound, the third patterned metal layer being exposed through the molding compound.

20. The semiconductor device assembly of claim 1, wherein the conductive via is configured to receive a signal pin.

21. The semiconductor device assembly of claim 13, wherein the plurality of extensions are located outside of a perimeter of the surface of the first dielectric layer.

* * * * *